United States Patent
Ahmadian

Patent Number: 5,914,677
Date of Patent: Jun. 22, 1999

[54] APPARATUS AND METHOD FOR SCANNING A SWITCH ARRAY

[75] Inventor: Behnam H. Ahmadian, Los Gatos, Calif.

[73] Assignee: Chips & Technologies, Inc., San Jose, Calif.

[21] Appl. No.: 08/779,284

[22] Filed: Jan. 15, 1997

[51] Int. Cl.⁶ .................................................. H03M 11/20
[52] U.S. Cl. ........................ 341/26; 340/825.79; 364/189
[58] Field of Search ........................ 341/26, 22; 364/189; 340/825.79

[56] References Cited

U.S. PATENT DOCUMENTS

| | | | |
|---|---|---|---|
| 4,021,656 | 5/1977 | Caudel | 341/26 |
| 4,701,748 | 10/1987 | Ushiki | 341/26 |
| 5,025,255 | 6/1991 | Mould | 341/26 |
| 5,280,283 | 1/1994 | Raasch | 341/26 |
| 5,539,400 | 7/1996 | Mears | 241/26 |
| 5,621,402 | 4/1997 | Spak | 341/26 |

Primary Examiner—Michael Horabik
Assistant Examiner—Albert K. Wong
Attorney, Agent, or Firm—D'Alessandro & Ritchie

[57] ABSTRACT

A switch array decoding circuit, suitable for use in a keyboard, and method according to the present invention comprises a matrix of row lines and column lines. Switches from the array are connected between intersections of the row lines and column lines. The row lines and column lines are connected to I/O pins leading to one or more components containing the decoder circuitry. The decoder circuitry first simultaneously drives the row lines while sensing the column lines. When a switch closure is detected, the states of all column lines are simultaneously sensed. This operation determines the column position(s) of the one or more switches being closed. The column lines are then simultaneously driven while simultaneously sensing the row lines. This operation determines the row position(s) of the one or more switches being closed. The row and column drive and sense order may be reversed.

16 Claims, 4 Drawing Sheets

APPARATUS AND METHOD FOR SCANNING A SWITCH ARRAY

BACKGROUND OF THE INVENTION

1. Field of the Invention

The present invention relates to any device containing an array of switches. More particularly, this invention relates to a method and apparatus for scanning a switch array, such as a computer keyboard, to determine the closed or open position of each switch, or in the case of a keyboard, which key is being pressed, using few output pins and without requiring multiple clock signals.

2. The Background Art

In computer systems, adding machines, calculators, and other devices containing switches, it is necessary to efficiently determine the position of a switch, or in, the case of a keyboard, which key is being pressed by a user, in order to properly determine what the next action is with respect to that switch position or keypress.

Because a keyboard is a common form of switch array familiar to those of ordinary skill in the art, a keyboard will be used as the preferred example of how this invention is implemented. However, as is readily understood by those skilled individuals, the present invention pertains to switch arrays in general, and may be implemented in a variety of applications containing internal and external switches.

Keyboard designs use one of two methods of determining which key is pressed. One method in use for smaller keyboards is to use one sensing pin per key. According to this method, a fixed voltage is supplied to one terminal of each key switch, and the other terminal of each key switch is connected to an I/O pin of the integrated circuit device containing the keyboard decoder circuitry. When the key is pressed to close the switch, the fixed voltage appears at the I/O pin associated with the key.

Although this method is accurate, it suffers because a separate I/O pin is required for each key on the keyboard. Thus, a standard 101-key computer keyboard would require 101 interface pins. Clearly this method becomes unmanageable and inappropriate for keyboards containing large numbers of keys. It would therefore be advantageous to provide a method for reading a keyboard using fewer pins than the number of keys on the keyboard.

A second method in common use is to provide a matrix of rows and columns of key lines. Key switches are disposed between the row and column lines at intersections thereof. According to this method, the integrated circuit containing the keyboard decoder need only contain a single I/O pin for each row and each column in the matrix. Thus, a fifteen-key keyboard may be scanned using only 8 I/O pins, e.g., five for rows and three for columns, or by any other similar combination of rows and columns.

Prior art keyboards using this second method drive each of one set of lines one at a time and sense the other set of lines for keypress indications. In an example where the row lines are driven and the column lines sensed, the identity of the key being pressed is determined by which column line senses the drive signal, and which of the drive signals is being sensed. This method thus requires both positional and temporal decoding.

A multiphase clock signal is typically used in keyboards which operate according to this second method. The identity of the pressed key may be determined by which driven signal is sensed by which sense line.

Though the method described above is useful for its intended purposes, it suffers from the need to have multiphase clock signals with one phase per driven line. It would therefore be advantageous to provide a method for decoding keyboard keypresses without the need for running a multiphase clock.

OBJECTS AND ADVANTAGES OF THE INVENTION

Accordingly, it is an object and advantage of the present invention to provide an apparatus and method for reading a keyboard using fewer pins than the number of keys on the keyboard.

It is a further object and advantage of the present invention to provide an apparatus and method of reading keyboard keypresses without the need for running a multiphase clock.

These and many other objects and advantages of the present invention will become apparent to those of ordinary skill in the art from a consideration of the drawings and ensuing description of the invention.

SUMMARY OF THE INVENTION

A switch array decoding circuit, suitable for use with a keyboard, according to the present invention comprises a matrix of first lines and second lines. Keyswitches from the keyboard are connected between intersections of the first lines and second lines. The first lines and second lines are connected to I/O pins on one or more components containing the keyboard decoder circuitry. In one embodiment of the invention the first lines may be row lines and the second lines may be column lines. According to another embodiment of the invention the first lines may be column lines and the second lines may be row lines.

According to the method of the present invention, the decoder circuitry according to the present invention first simultaneously drives the first lines while sensing the second lines. When a keypress is detected, the decoder circuitry then reverses the identities of the driven and sensed lines. For example, first the row lines may be simultaneously driven. When a keypress is detected, the states of all column lines are simultaneously sensed. This operation determines the column position(s) of the one or more keys being pressed. The column lines are then simultaneously driven while simultaneously sensing the row lines. This operation determines the row position(s) of the one or more keys being pressed.

The apparatus and method of the present invention uses keyboard interface I/O pins efficiently, and does not require the generation and use of a multiphase clock. Because a multiphase clock is not required, a keyboard utilizing the invention may advantageously operate in environments where low power consumption is required, or where increased electromagnetic disturbances might make running a clock undesirable.

DESCRIPTION OF THE PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
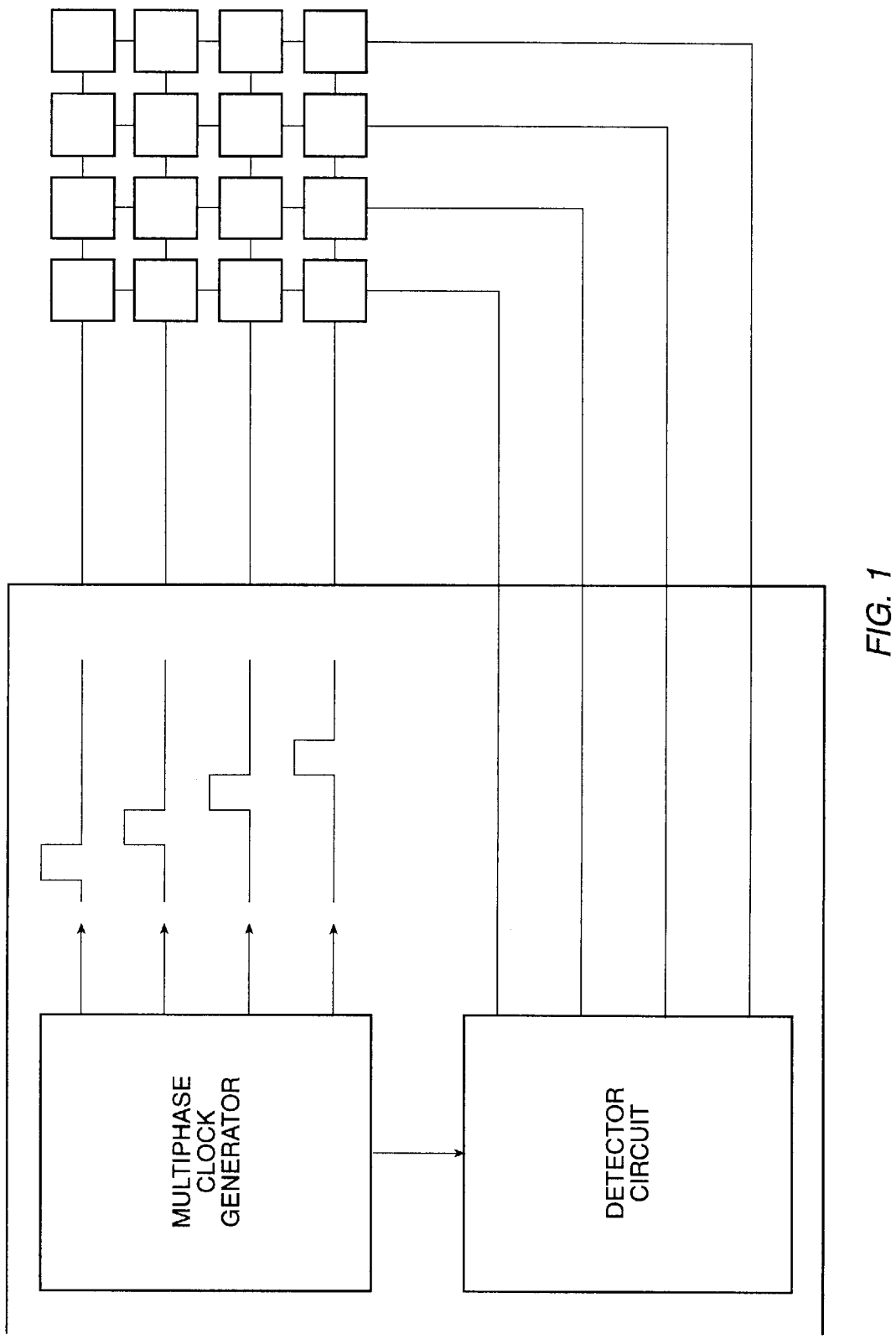
FIG. 1 is a diagram showing the operation of a prior-art multiphase clock-based keyboard decoding scheme.

Referring first to FIG. 1, a brief description of the operation of prior-art matrix keyboard decoders will be given. As shown in FIG. 1, the conductors in one direction of the matrix, either row or column (row is shown), are sequentially strobed high by a multiphase clock generator circuit. For purposes of this discussion, assume that the row conductors are sequentially strobed. If any key is pressed, two pieces of information are used to determine the identity of the pressed key. The first information is the identity of the column line which returns the strobed pulse, providing the column information for the pressed key. This information is provided by the detector circuit.

The second information is the timing of the returned pulse on the column line, which identifies the row of the pressed key by its coincidence with one of the clock phases. Those of ordinary skill in the art will recognize that multiple simultaneously pressed keys can be identified, since either multiple columns will return a strobed pulse, multiple strobed pulses will appear on a single column, or multiple pulses will be returned on multiple columns.

Figure 2:
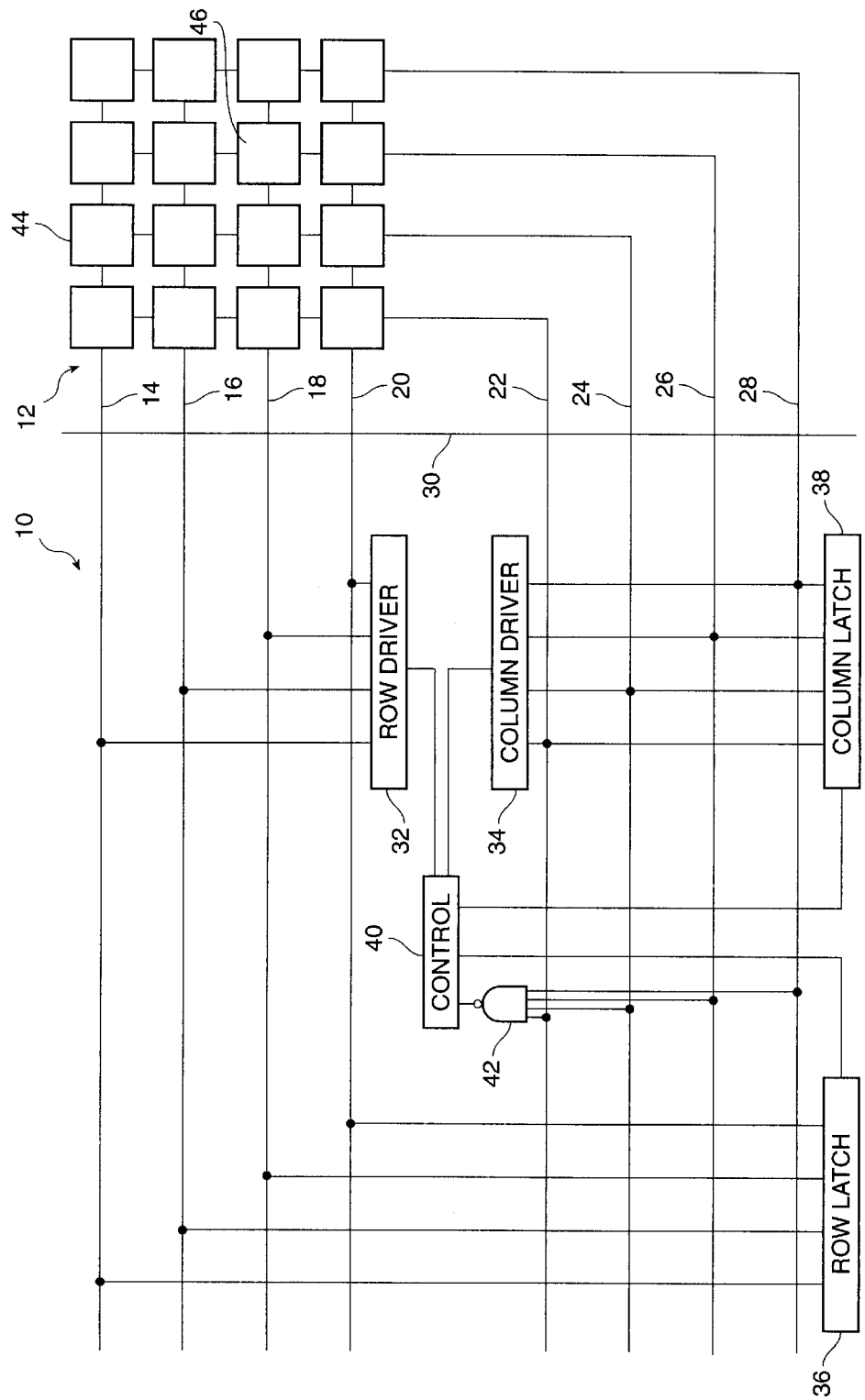
FIG. 2 is a block diagram of illustrative circuitry used to implement the keyboard decoding scheme of the present invention.

Referring now to FIG. 2, a decoder 10 according to the present invention is illustrated in block diagram form. M×N key matrix 12 including M rows and N columns is arranged so that each key, when pressed, closes a switch which connects a row line to a column line. Those of ordinary skill in the art will recognize that although FIG. 2 depicts an illustrative matrix including four rows and four columns, a key matrix of arbitrary size can be used with the present invention. Thus row lines 14, 16, 18, and 20 intersect column lines 22, 24, 26, and 28.

Vertical line 30 represents the boundary of an integrated circuit lying to the left thereof, which preferably includes the decoder circuit 10 of the present invention. Decoder circuit 10 is seen to include row driver circuit 32, column driver circuit 34, row latch 36, and column latch 38. Row driver circuit 32 and row latch 36 are connected to the row lines 14, 16, 18, and 20 and column driver circuit 34 and column latch 38 are connected to the column lines 22, 24, 26, and 28.

In an embodiment where the row and column lines are to be driven to a low logic state, row and column driver circuits may comprise, for example, N-Channel MOS transistors each having a drain pullup resistor connected to the positive voltage supply. One row or column line is connected to the drain of each transistor. The gates of all of the transistors are driven from the same signal source. Row latch 36 and column latch 38 may comprise conventional data latch circuits.

Control circuitry 40 directs the operation of the decoder 10 of the present invention. Control circuitry 40 may comprise a microprocessor, state machine, or other equivalent circuit for performing the function to be described herein. Once the function to be performed as disclosed herein is understood, configuration of a microprocessor, state machine or other circuit to perform this function is a trivial task.

The following description of the operation of the present invention assumes that the row lines are driven first, but those of ordinary skill in the art will understand that the order of the drive and sense operations of the row and column lines are interchangeable according to the present invention.

Control circuitry 40 sends a signal to row driver circuit 32, causing it to pull down all row lines to a low logic level. At this time, the column lines are set to sense keypresses. If no key is pressed, the column lines 22, 24, 26, and 28 are held high. The decoder circuit 10 of the present invention stays in this state until one or more keys on key matrix 12 is pressed. When at least one key is depressed, at least one of column lines 22, 24, 26, and 28 is driven low through the pressed keyswitch. This low condition is sensed by NAND gate 42, which communicates that condition to control circuit 40. Control circuit 40 then performs several steps. First, it strobes column latch 38 to store the states of column lines 22, 24, 26, and 28. Then, it de-activates row driver circuit 32 and activates column driver circuit 34. After column driver circuit 34 has been activated, control circuit 40 strobes row latch 36 to store the states of row lines 14, 16, 18, and 20.

Those of ordinary skill in the art will recognize that the timing of the steps performed by control circuit 40 should be quick enough so as to capture the states of the row and column lines in latches 36 and 38 while the key is still depressed. Given the speed of modern digital circuits, this is easily achieved. Such skilled persons will also recognize that if the order of operation of the keyboard decoder circuit 10 is reversed, i.e., the column lines 22, 24, 26, and 28 are driven, rather than sensed, first, NAND gate 42 will have its inputs connected instead to row lines 14, 16, 18, and 20.

As an example of the operation of the present invention, assume that key 44 (the second key in the first row of key matrix 12) and key 46 (the third key in the third row of key matrix 12) have been pressed. First, column lines 24 and 26 will be pulled low. The output of NAND gate 42 will go high and control circuitry 40 will direct performance of the following tasks. The binary bits 1001, representing the status of column lines 22, 24, 26, and 28, will be stored in column latch 38. Row driver 32 will be deactivated, column driver 34 will be activated, and row lines 14 and 18 will be pulled low. The binary bits 0101, representing the status of row lines 14, 16, 18, and 20, will be stored in row latch 36. The contents of latches 36 and 38 can be decoded to identify the keys being pressed.

Figure 3:
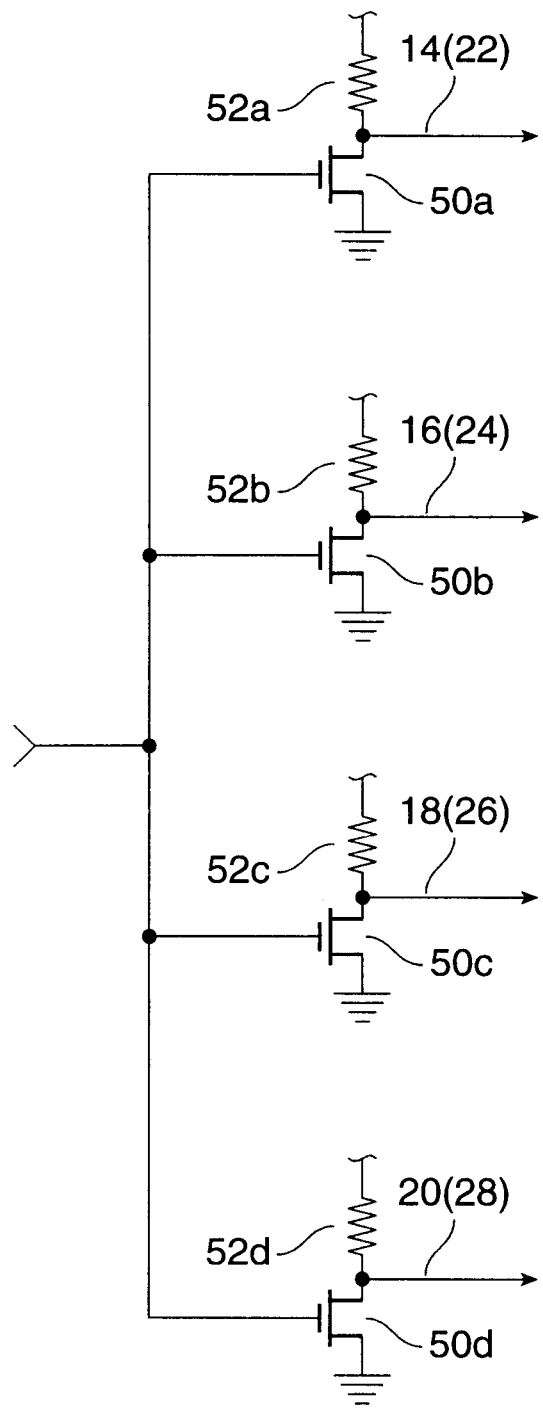
FIG. 3 is a schematic diagram of an illustrative drive and pullup circuit for use with the present invention.

Referring now to FIG. 3, schematic diagram of an illustrative driver circuit for use in the present invention. The circuit of FIG. 3 can be used as row driver circuit 32 and column driver circuit 34. The circuit of FIG. 3 is useful for both driving the row and column lines and for pullup of those lines when they are not being driven.

The circuit of FIG. 3 includes a plurality of N-Channel MOS transistors 50a through 50d, each having a grounded source, a gate connected to the gates of all of the other N-Channel MOS transistors, and a drain connected to a positive voltage source through a pullup resistor 52a through 52d. The drain of each N-Channel MOS transistors 50a through 50d is connected to a different one of the row (or column) lines as indicated by the reference numerals in parentheses. Thus N-Channel MOS transistor 50a is shown connected to row line 14 (or to column line 22), N-Channel MOS transistor 50b is shown connected to row line 16 (or to column line 24), N-Channel MOS transistor 50c is shown connected to row line 18 (or to column line 26), N-Channel MOS transistor 50d is shown connected to row line 20 (or to column line 28). There will be two such circuits in any keyboard decoder circuit according to the present invention.

To drive the row or column lines associated with the circuit of FIG. 3, the common connection to all the gates of the transistors 50a through 50d is brought high, thus turning on all of the transistors and pulling the associated row or column lines to the level of the ground or reference voltage.

When the transistors 50*a* through 50*d* are turned off (common connection low), the resistors 52*a* through 52*d* serve as pullup devices and keep the row (or column) lines to which they are connected pulled up to the supply voltage unless they are pulled down by the driven lines through a closed keyswitch.

Those of ordinary skill in the art will readily recognize that other driver circuits are commonly available, and this particular arrangement is not intended to be limiting the invention in any way.

An alternative embodiment, providing seperate connections for each gate of each MOS transistor would allow the detection of the condition of a switch in a particular row of a switch array. On this way, certain rows or columns could be enabled for detection by selectively driving only those rows or columns, and ignoring other rows or columns for which information is not desired.

After any required processing actions have been taken based on the detection of the pressed key, the system resets to a default state, allowing a new keypress to be sensed.

Because this system uses bidirectional circuitry to sense the row and column of a keypress, there is no clock required, and the system avoids the need for complicated timing circuitry.

Figure 4:
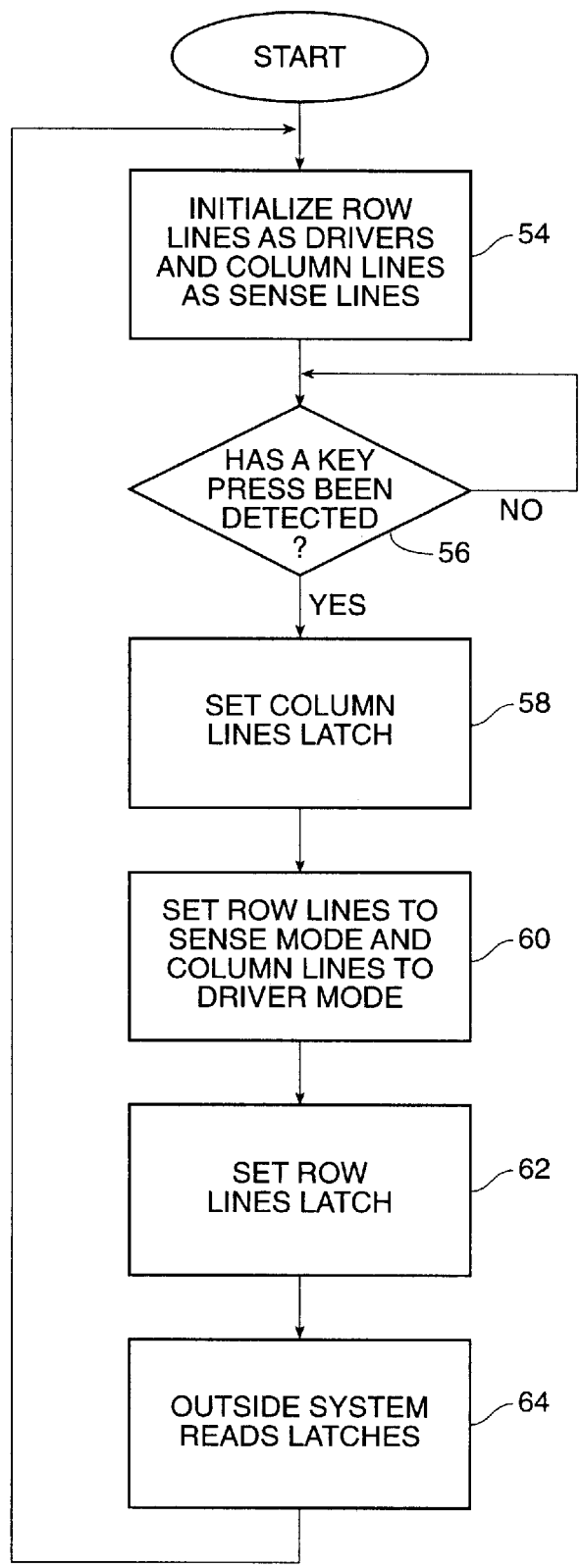
FIG. 4 is a flow chart illustrating the steps involved in the method of the present invention.

FIG. 4 is a flow chart illustrating the steps involved in the method of the present invention.

Referring to FIG. 4, the system is initialized in step 54 wherein the row lines are set up as drivers and column lines are set up as sense lines. Recall that rows and columns are interchangeable, and thus you may begin either in the configuration specified above, or in an alternate configuration using column lines as drivers and row lines as sense lines.

In step 56, the system is idle until a keypress is detected. Once a keypress is detected, in step 58 the column latch is set, capturing the column line(s) containing the key or keys being pressed. Once the latch is set, the configuration of row and column lines is swapped in step 60. At this time, in a preferred embodiment of the present invention, the row lines are now sense lines and the column lines are drivers.

In step 62, the row latch is set, capturing the row line(s) containing the key(s) being pressed. In step 64, the outside using system reads the configuration of the latches and can determine the key being pressed.

Those individuals of ordinary skill in the art will readily recognize that this invention is not restricted to keyboards. Rather, it is useful in detecting the switch position of switches in many different configurations. In a system using the present invention to read the configuration of a switch panel, this method would be modified so that step 56 would be removed, and the flow would begin with an outside system triggering the process of initializing and then reading the switches. In this case, the condition of the latches would reflect the position of the switches at the time the latches were set.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for decoding the status of switches in a switch array having at least one switch closed, comprising the steps of:

providing a matrix including a plurality of first lines and a plurality of second lines;

connecting individual switches from the switch array across ones of said first and second lines;

simultaneously driving all of said first lines while sensing said second lines;

detecting a closed switch and in response latching the states of said second lines and then in order driving all of said second lines and latching the states of said first lines; and evaluating the latched states of the first and second lines.

2. An apparatus for decoding closed switches in a switch array, comprising:

a matrix including a plurality of first lines and a plurality of second lines;

individual switches from the switch array connected across ones of said first and second lines;

first driving circuitry coupled to said first lines, wherein said first driving circuitry drives all of said first lines simultaneously when instructed;

a first latch for latching said second lines;

second driving circuitry coupled to said second lines, wherein said second driving circuitry drives all of said second lines simultaneously when instructed;

a second latch for latching said first lines;

switch detection circuitry coupled to said second lines for producing a switch closure signal when a switch is closed on the switch array; and control circuitry communicating with said first and second driving circuits, said first and second latches, and said switch detection circuitry for activating said first driving circuitry, and for responding to said switch closure signal by strobing said first latch to latch the states of said second lines and then in order deactivating said first driving circuitry, activating said second driving circuitry, and strobing said second latch to latch the states of said first lines.

3. A method for decoding keypresses on a keyboard, comprising the steps of:

providing a matrix including a plurality of first lines and a plurality of second lines;

connecting individual keyswitches from the keyboard across ones of said first and second lines;

simultaneously driving all of said first lines while sensing said second lines;

detecting a key press and in response latching the states of said second lines and then in order driving all of said second lines and latching the states of said first lines; and evaluating the latched states of the first and second lines.

4. A method for decoding keypresses on a keyboard, comprising the steps of:

providing a matrix including a plurality of first lines and a plurality of second lines;

connecting individual normally-closed keyswitches from the keyboard across ones of said first and second lines;

simultaneously driving all of said first lines while sensing said second lines;

detecting a key press and in response latching the states of said second lines and then in order driving all of said second lines and latching the states of said first lines; and evaluating the latched states of the first and second lines.

5. An apparatus for decoding keypresses on a keyboard, comprising:

a matrix including a plurality of first lines and a plurality of second lines;

individual normally-open keyswitches from the keyboard connected across ones of said first and second lines;

first driving circuitry coupled to said first lines, wherein said first driving circuitry drives all of said first lines simultaneously when instructed;

a first latch for latching said second lines;

second driving circuitry coupled to said second lines, wherein said second driving circuitry drives all of said second lines simultaneously when instructed;

a second latch for latching said first lines;

keypress detection circuitry coupled to said second lines for producing a keydown signal when a key is pressed on the keyboard; and control circuitry communicating with said first and second driving circuits, said first and second latches, and said keydown detection circuitry for activating said first driving circuitry, and for responding to said keydown signal by strobing said first latch to latch the states of said second lines and then in order deactivating said first driving circuitry, activating said second driving circuitry, and strobing said second latch to latch the states of said first lines.

6. The apparatus of claim 2 wherein said control circuitry comprises a microprocessor.

7. The apparatus of claim 4 wherein said control circuitry comprises a microprocessor.

8. The apparatus of claim 2 wherein said first driving circuitry comprises a plurality of MOS transistors, each having a grounded source, the gate of each of said MOS transistors being connected to the gate of all other MOS transistors in said first driving circuitry and also to said control circuitry, the drain of each MOS transistor being connected to a different first line than all other MOS transistors in said first driving circuitry.

9. The apparatus of claim 2 wherein said second driving circuitry comprises a plurality of MOS transistors, each having a grounded source, the gate of each of said MOS transistors being connected to the gate of all other MOS transistors in said first driving circuitry and also to said control circuitry, the drain of each MOS transistor being connected to a different second line than all other MOS transistors in said second driving circuitry.

10. The apparatus of claim 4 wherein said first driving circuitry comprises a plurality of MOS transistors, each having a grounded source, the gate of each of said MOS transistors being connected to the gate of all other MOS transistors in said first driving circuitry and also to said control circuitry, the drain of each MOS transistor being connected to a different first line than all other MOS transistors in said first driving circuitry.

11. The apparatus of claim 4 wherein said second driving circuitry comprises a plurality of MOS transistors, each having a grounded source, the gate of each of said MOS transistors being connected to the gate of all other MOS transistors in said second driving circuitry and also to said control circuitry, the drain of each MOS transistor being connected to a different second line than all other MOS transistors in said second driving circuitry.

12. The apparatus of claim 2 wherein said first driving circuitry comprises a plurality of MOS transistors, each having a grounded source, the gate of each of said MOS transistors being individually connected to said control circuitry, the drain of each MOS transistor being connected to a different first line than all other MOS transistors in said first driving circuitry.

13. The apparatus of claim 2 wherein said second driving circuitry comprises a plurality of MOS transistors, each having a grounded source, the gate of each of said MOS transistors being individually connected to said control circuitry, the drain of each MOS transistor being connected to a different second line than all other MOS transistors in said second driving circuitry.

14. The apparatus of claim 4 wherein said first driving circuitry comprises a plurality of MOS transistors, each having a grounded source, the gate of each of said MOS transistors being individually connected to said control circuitry, the drain of each MOS transistor being connected to a different first line than all other MOS transistors in said first driving circuitry.

15. The apparatus of claim 4 wherein said second driving circuitry comprises a plurality of MOS transistors, each having a grounded source, the gate of each of said MOS transistors being individually connected to said control circuitry, the drain of each MOS transistor being connected to a different second line than all other MOS transistors in said second driving circuitry.

16. A method for decoding the status of switches in a switch array having at least one witch closed, the individual switches from the switch array coupled across ones of a plurality of first lines and second lines in a matrix, including the steps of:

simultaneously driving all of the first lines while sensing the second lines;

detecting a closed switch and in response latching the states of the second lines and then in order driving the second lines and latching the states of the first lines; and evaluating the latched states of the first and second lines.

* * * * *

UNITED STATES PATENT AND TRADEMARK OFFICE
CERTIFICATE OF CORRECTION

PATENT NO. : 5,914,677
DATED : June 22, 1999
INVENTOR(S) : Behnam H. Ahmadian

It is certified that error appears in the above-identified patent and that said Letters Patent is hereby corrected as shown below:

In column 5, line 14, replace "On" with --In--.

In the Claims

In column 8, line 42, replace "witch" with --switch--.

Signed and Sealed this

Twenty-third Day of November, 1999

*Attest:*

Q. TODD DICKINSON

*Attesting Officer*    *Acting Commissioner of Patents and Trademarks*